(12) United States Patent
Fischer et al.

(10) Patent No.: US 9,027,239 B2
(45) Date of Patent: May 12, 2015

(54) METHOD FOR PLUGGING A HOLE

(75) Inventors: Andreas Fischer, Johanneshov (SE); Göran Stemme, Lidingö (SE); Frank Niklaus, Täby (SE); Niklas Roxhed, Bromma (SE)

(73) Assignee: Aerocrine AB, Solna (SE)

( * ) Notice: Subject to any disclaimer, the term of this patent is extended or adjusted under 35 U.S.C. 154(b) by 162 days.

(21) Appl. No.: 13/511,486

(22) PCT Filed: Dec. 17, 2010

(86) PCT No.: PCT/EP2010/070084
§ 371 (c)(1),
(2), (4) Date: Sep. 6, 2012

(87) PCT Pub. No.: WO2011/073393
PCT Pub. Date: Jun. 23, 2011

(65) Prior Publication Data
US 2013/0012078 A1  Jan. 10, 2013

(30) Foreign Application Priority Data
Dec. 18, 2009  (SE) ...................................... 0901586

(51) Int. Cl.
*H01R 9/00* (2006.01)
*H05K 3/00* (2006.01)
(Continued)

(52) U.S. Cl.
CPC ....... *B81C 1/00293* (2013.01); *B01L 3/502707* (2013.01); *B01L 2300/042* (2013.01);
(Continued)

(58) Field of Classification Search
CPC ............ H01L 41/29; B01L 2200/0689; B81C 2203/0109; B81C 2203/019; B81C 3/001; B32B 37/10; B32B 37/1009
USPC ........... 29/845, 428, 458, 825, 844, 846, 851, 29/852; 428/34.6, 426, 428, 432; 439/884
See application file for complete search history.

(56) References Cited

U.S. PATENT DOCUMENTS

| 5,329,423 A | 7/1994 | Scholz | |
| 7,174,632 B2 * | 2/2007 | Kawakita et al. | ............... 29/852 |

(Continued)

FOREIGN PATENT DOCUMENTS

| JP | 2003-115658 | 4/2003 |
| WO | 02/053921 | 7/2002 |

OTHER PUBLICATIONS

International Search Report for corresponding International Application No. PCT/EP2010/070084 mailed Jun. 27, 2011.
(Continued)

*Primary Examiner* — Thiem Phan
(74) *Attorney, Agent, or Firm* — Renner, Otto, Boisselle & Sklar, LLP

(57) ABSTRACT

A method for at least partially inserting a plug into a hole, said method comprising the steps of a) providing a at least one substrate with at least one hole wherein said at least one hole has a largest dimension of from 1 μm to 300 μm, b) providing a piece of material, wherein said piece of material has a larger dimension than said at least one hole, c) pressing said piece of material against the hole with a tool so that a plug is formed, wherein at least a part of said piece of material is pressed into said hole, d) removing the tool from the piece of material. There is further disclosed a plugged hole manufactured with the method. One advantage of an embodiment is that an industrially available wire bonding technology can be used to seal various cavities. The existing wire bonding technology makes the plugging fast and cheap.

9 Claims, 12 Drawing Sheets

(51) Int. Cl.
    *B81C 1/00* (2006.01)
    *B01L 3/00* (2006.01)
(52) U.S. Cl.
    CPC ... *B81B2201/058* (2013.01); *B81B 2203/0315* (2013.01); *B81C 2201/019* (2013.01); *B81C 2203/0145* (2013.01)
    USPC .................................. 29/845; 29/428; 29/844

(56) References Cited

U.S. PATENT DOCUMENTS

| | | | |
|---|---|---|---|
| 2006/0115323 A1 | 6/2006 | Coppeta et al. | |
| 2006/0170112 A1 | 8/2006 | Tanaka et al. | |
| 2006/0231148 A1 | 10/2006 | Watanabe | |
| 2007/0210425 A1 | 9/2007 | Ramakrishna et al. | |
| 2008/0000948 A1 | 1/2008 | Blanc et al. | |
| 2009/0117336 A1 | 5/2009 | Usui et al. | |

OTHER PUBLICATIONS

Written Opinion of the International Searching Authority for corresponding International Application No. PCT/EP2010/070084 mailed Jun. 27, 2011.

Notice of Reasons for Rejection in corresponding Japanese Patent Application No. 2012-543790 dated Nov. 21, 2014 and English translation.

* cited by examiner

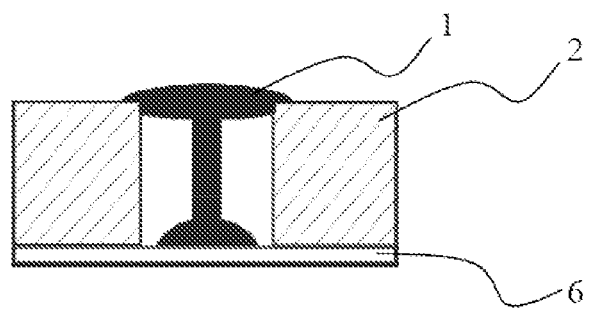
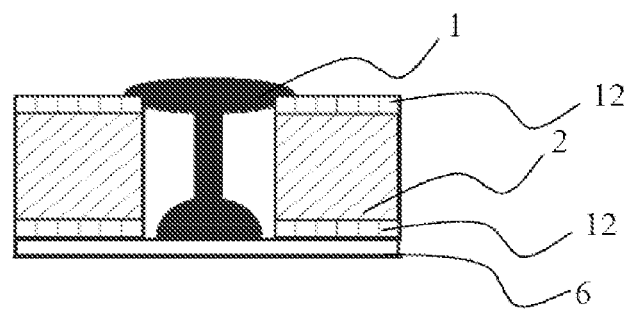
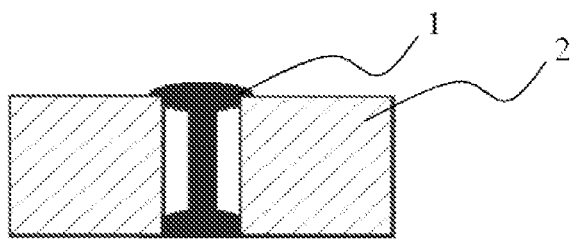
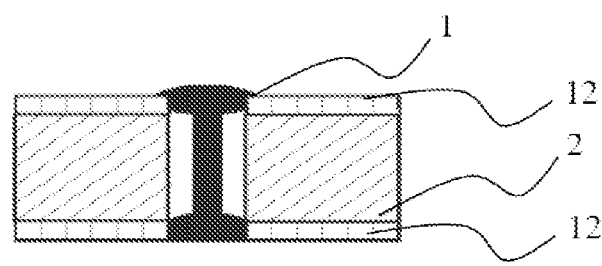
Figure 5 a, b, d, and d (top to bottom)

METHOD FOR PLUGGING A HOLE

This application is a national phase of International Application No. PCT/EP2010/070084 filed Dec. 17, 2010 and published in the English language, which claims priority to SE 0901586-8 filed Dec. 18, 2009.

TECHNICAL FIELD

The present invention concerns a technology to create plugs for holes and cavities.

BACKGROUND ART

Liquid-integration already at the microfabrication stage is a new enabling feature for MEMS with applications to life-science devices, high-sensitivity sensors where the liquid state can enhance sensing capabilities, and MEMS lenses. Specific examples include MEMS-based drug delivery systems which are prefilled with drugs or protein solutions, liquid-based electrochemical sensors using liquid electrolytes which enable sensitivity levels in the ppb-range and miniaturized optical lenses. The difficulties related to liquid integration in MEMS often relate to the diminished temperature budget in processing which occurs when the liquid is integrated. This can be as low as 37° C. for sensitive or living materials in for instance life-science applications. In traditional wafer-level integration schemes the liquid is hermetically plugged inside the cavity during the wafer bonding process. This forces the cavity formation and sealing, i.e. wafer bonding, to use room temperature processes, specifically adhesive wafer bonding.

Previously there has been used wafer level room temperature hermetic liquid sealing by gold ring embossing, where a smaller gold ring on one wafer is compressed towards, and partially embedded in, a larger gold ring on the other wafer. There has also been shown cold welding of overlapping gold sealing rings with negative-slope sidewall angles. Both these methods seal the liquid in the cavity during wafer bonding and require additional mechanical stabilization afterwards. This was implemented using polymer underfills. These methods have the advantage that they can be more hermetic than pure adhesive wafer bonding since the seal is metallic instead of polymeric. A potential limitation is the fact that the liquid was pipetted into every cavity using a serial process. This was recently addressed using a method of cavity formation and cavity sealing with the wafers submerged in the liquid to be integrated. This method is however unsuitable when compared to serial pipetting for some applications. These applications could be integrating solutions which may pollute or alter the surface it comes in contact with, for instance surface fouling proteins, or when there is a risk of contaminating the liquid from the "immersion bonding" process itself. The pipetting method also has the advantage of being able to integrate two liquids, a necessity for the previously mentioned lens.

Thus there need in packaging of MEMS (Micro Electro-Mechanical Systems) devices for providing them with hermetic packages, either to protect their structures from harsh external environments and/or to ensure special atmospheric conditions or temperature sensitive liquids inside the package to ensure the functionality of the device.

Wafer-level bonding techniques are widely used for this purpose. Conventional techniques like fusion bonding, compression bonding, anodic bonding or eutectic bonding need high temperatures, high pressures, high voltage or special surface conditions. Such techniques contain process incompatibilities with many MEMS devices and are not compatible with standard microelectronic manufacturing processes. The hermetic sealing of MEMS devices and/or microelectronic circuits according to the state of the art give high manufacturing costs.

A lot of effort has been invested to develop bonding methods compatible to standard microelectronic processes. Newer techniques such as localized heating bonding require complicated structures and manufacturing steps. The sealing of the cavities with solder bonding does affect the atmosphere inside the cavity. The use of low temperature adhesive bonding techniques does not achieve hermetically plugged cavities.

Therefore, a technology is needed to hermetically plug cavities by wafer or chip level sealing of cavity holes to seal gas, vacuum or liquid filled the cavities at low temperatures.

SUMMARY OF INVENTION

It is an object of the present invention to obviate at least some of the disadvantages in the prior art and to provide and improved method for at least partially inserting a plug into a hole as well as a plugged hole.

In a first aspect there is provided a method for at least partially inserting a plug into a hole, said method comprising the steps of a) providing a at least one substrate with at least one hole wherein said at least one hole has a largest dimension of from 1 µm to 300 µm, b) providing a piece of material, wherein said piece of material has a larger dimension than said at least one hole, c) pressing said piece of material against the hole with a tool so that a plug is formed, wherein at least a part of said piece of material is pressed into said hole, d) removing the tool from the piece of material.

In a second aspect there is provided a plugged hole manufactured by providing a piece of material, wherein said piece of material has a larger dimension than said at least one hole, wherein said piece of material has been pressed against the hole with a tool so that at least a part of said material is in said hole forming a plug, wherein said hole has a largest dimension of from 1 µm to 300 µm.

Further aspects and embodiments are defined in the appended claims, which are specifically incorporated herein by reference.

One advantage of an embodiment is that an industrially available wire bonding technology can be used to plug various cavities. The existing wire bonding technology makes the process fast and cheap.

BRIEF DESCRIPTION OF DRAWINGS

The invention is now described, by way of example, with reference to the accompanying drawings, in which:

FIGS. 5 a and b show an embodiment where a wire bond is placed at the bottom surface or structure 6 of a through hole and a metal wire is provided that comprises a second wire ball 1 at the top edge of the via hole. The wire ball has a larger diameter than the hole and in a serial or parallel process, the ball(s) are then pressed in the hole (with force/pressure and with or without the help of increased temperature), and thereby providing a through substrate via that hermetically seals the front-side and the back-side of the substrate 2. In one embodiment the substrate is provided with a coating 12.

FIGS. 5 c and d show an embodiment with a first ball-bond with a ball size larger than the hole. The bond process deforms the piece of material 1 in a way that the mechanical connection takes place on the sidewalls of the hole. This process thus does not require a bondable surface 6 on the bottom of the cavity. The second (upper) piece of material 1 is for instance applied as in the embodiment described in FIGS. 5 a and b.

DETAILED DESCRIPTION

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

If nothing else is defined, any terms and scientific terminology used herein are intended to have the meanings commonly understood by those of skill in the art to which this invention pertains.

The term "about" as used in connection with a numerical value throughout the description and the claims denotes an interval of accuracy, familiar and acceptable to a person skilled in the art. Said interval is ±10%.

"Cavity" is used herein to denote space in a substrate. Typically a cavity has at least one opening to the surroundings.

"Hole" is used herein to denote an opening in a solid. An example of a through hole in a substrate includes a hole from one side of the substrate to another side of a substrate.

"Largest dimension" is used herein in connection with for instance a hole to denote the largest cross sectional distance of a hole. For a hole with a circular cross section it corresponds to the diameter, for a hole with a square cross section it corresponds to the diagonal.

"Plug" is used herein to denote a device intended to be inserted into a hole. A plug can be a seal.

"Seal" is used herein to denote a device which at least to some extent prevents leakage of material such as a fluid through a plugged hole.

In a first aspect there is provided a method for at least partially inserting a plug into a hole, said method comprising the steps of a) providing a at least one substrate with at least one hole wherein said at least one hole has a largest dimension of from 1 µm to 300 µm, b) providing a piece of material, wherein said piece of material has a larger dimension than said at least one hole, c) pressing said piece of material against the hole with a tool so that a plug is formed, wherein at least a part of said piece of material is pressed into said hole, d) removing the tool from the piece of material.

Figure 1A:
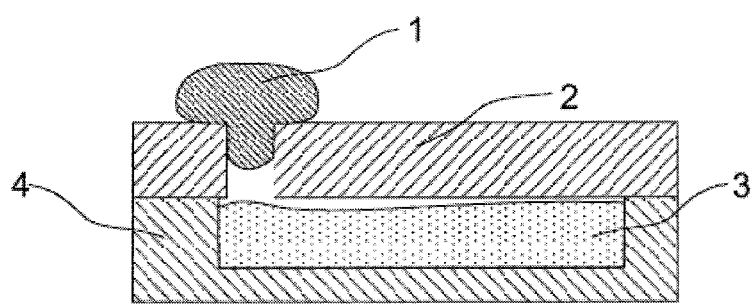
FIG. 1 *a-v* show various embodiments of plugged holes.
Figure 1B:
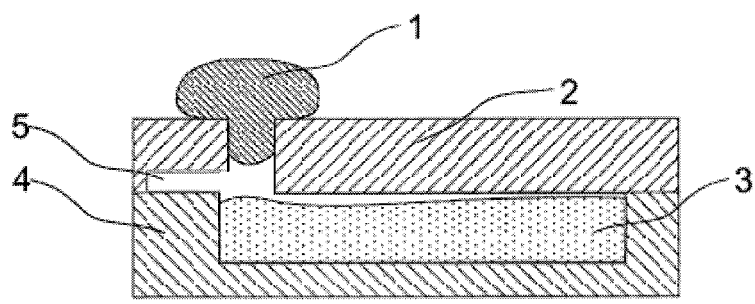
Figure 1C:
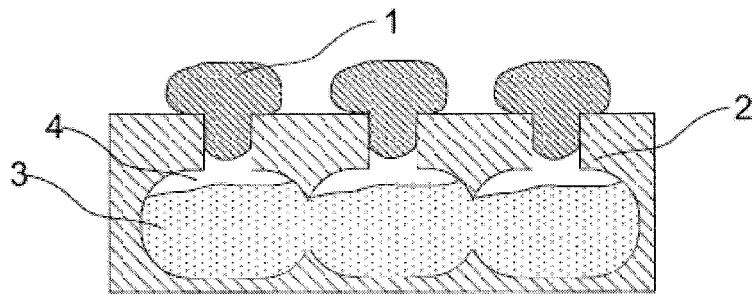
Figure 1D:
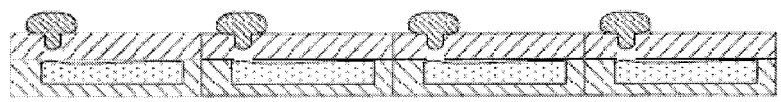
Figure 1E:
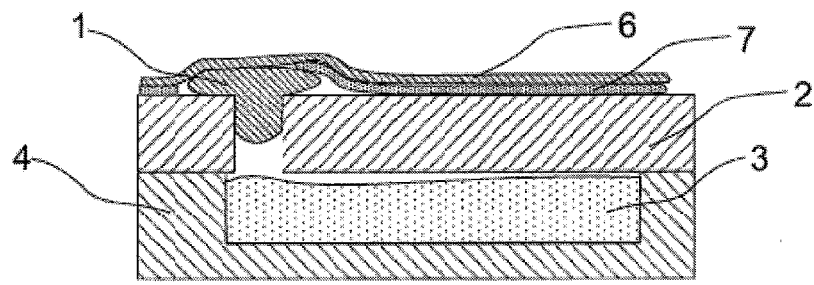
Figure 1F:
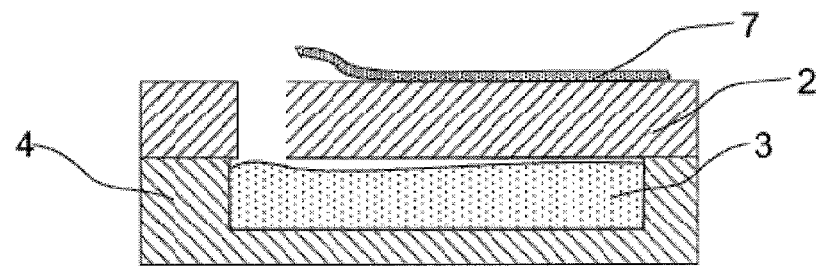
Figure 1G:
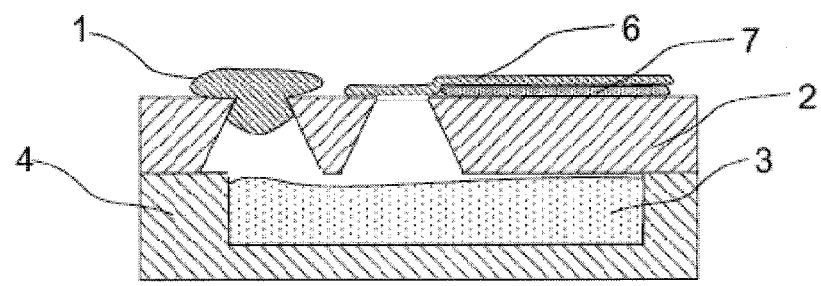
Figure 1H:
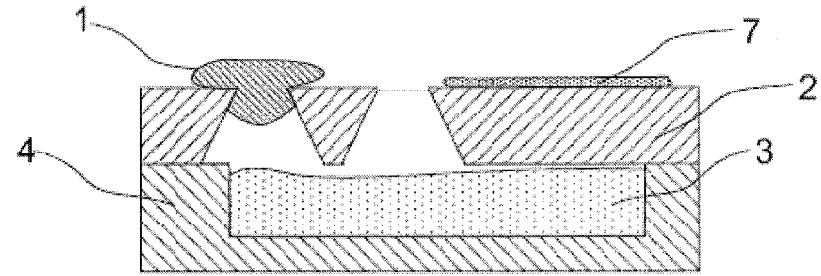
Figure 1I:
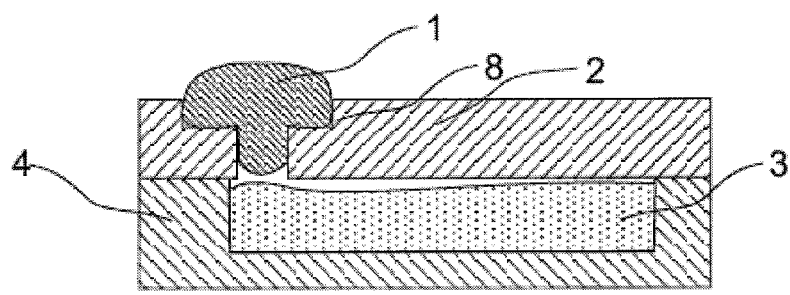
Figure 1J:
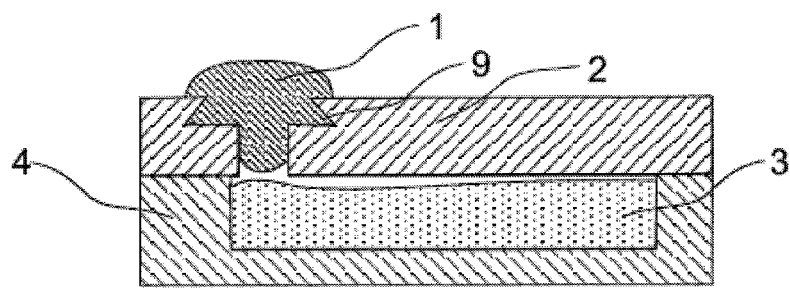

In one embodiment said at least one hole has a largest dimension from 1 to 200 µm. In another embodiment said at least one hole has a largest dimension from 1 to 150 µm. In an alternative embodiment said at least one hole has a largest dimension from 5 to 200 µm. In an alternative embodiment said at least one hole has a largest dimension from 10 to 150 µm. In an alternative embodiment said at least one hole has a largest dimension from 5 to 50 µm. In yet an alternative embodiment said at least one hole has a largest dimension from 50 to 150 µm. In one embodiment said at least one hole a diameter of about 100 µm. In one embodiment said at least one hole comprises at least one recess structure to enhance the deformation of said piece of material. An example of a recess 8 in the substrate 2 is depicted in FIG. 1i. This has the advantage of simplifying the deformation of the piece of material. In one embodiment the inside of said at least one hole is at least partially tapered. Examples of such embodiments are shown in FIGS. 1g, h, and j. This has the advantage of creating a plug which is better fixed to the substrate.

In one embodiment the material is subjected to at least one selected from heat, and ultrasound before pressing said piece of material against the hole. In one embodiment the material is subjected to at least one selected from heat, and ultrasound during pressing said piece of material against the hole. Combinations of the above embodiment are also encompassed. This will facilitate the formation of the material into a plug.

In one embodiment the material is melted into a piece of material with larger dimension than said at least one hole. Alternatively a piece of material is pressed against the hole without melting. In yet another alternative a wire is pressed against the hole. In one embodiment the material is provided as a wire.

Figure 1K:
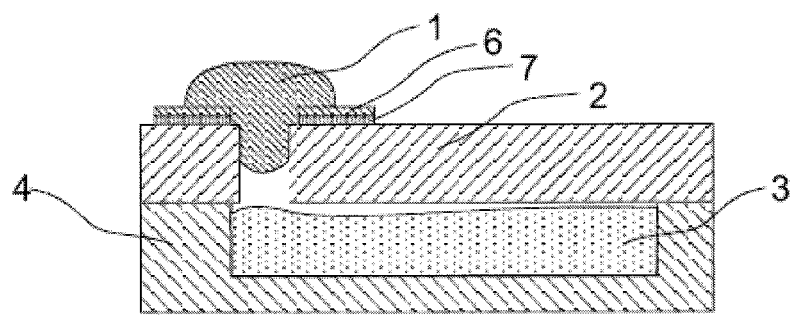
Figure 1L:
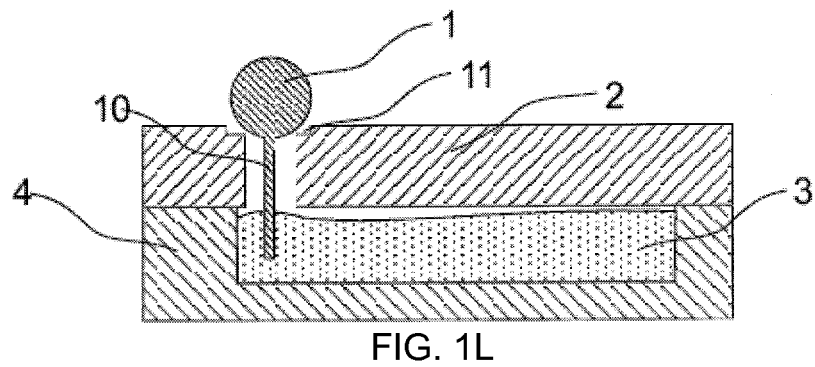
Figure 1M:
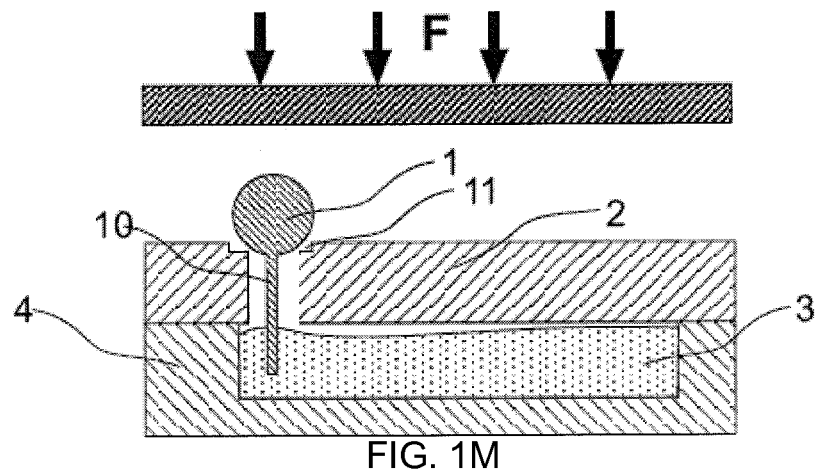
Figure 1N:
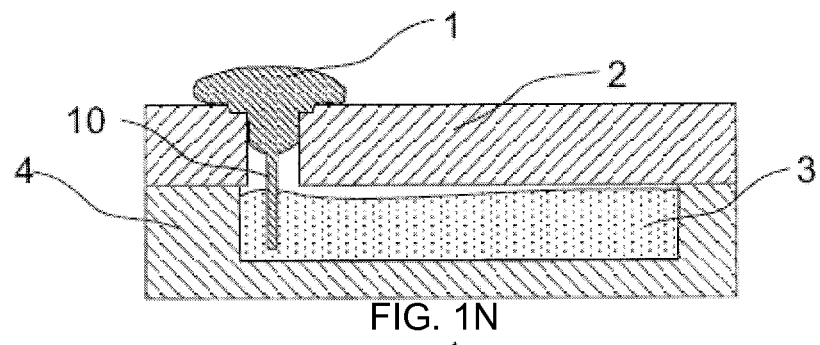
Figure 1O:
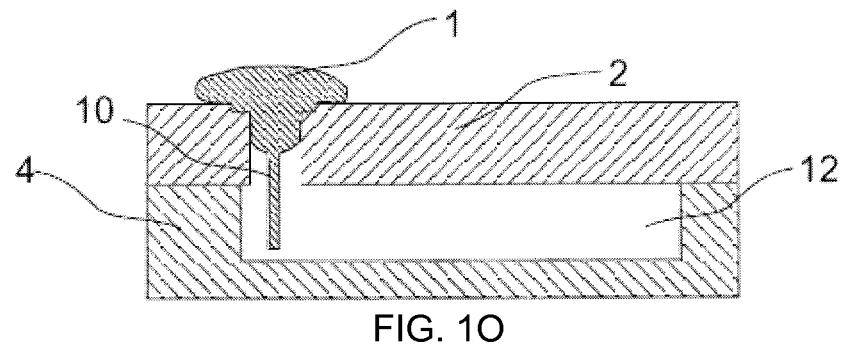
Figure 1P:
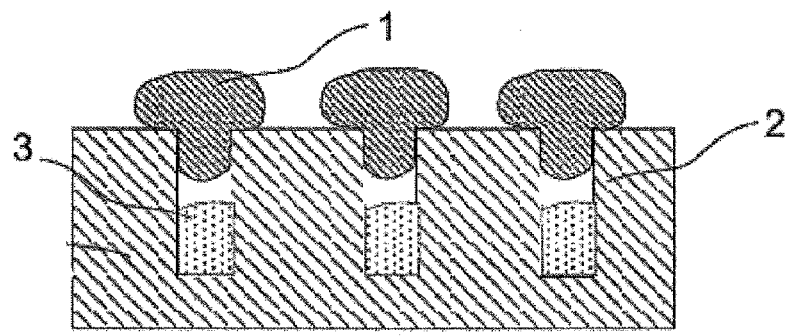
Figure 1Q:
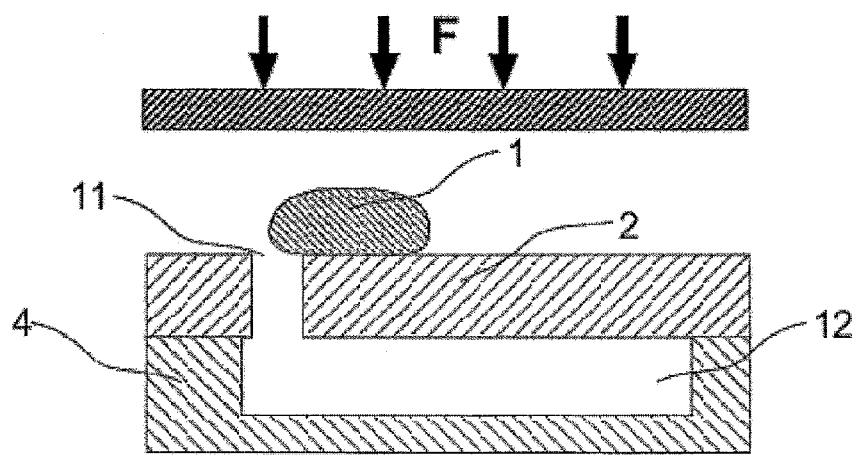
Figure 1R:
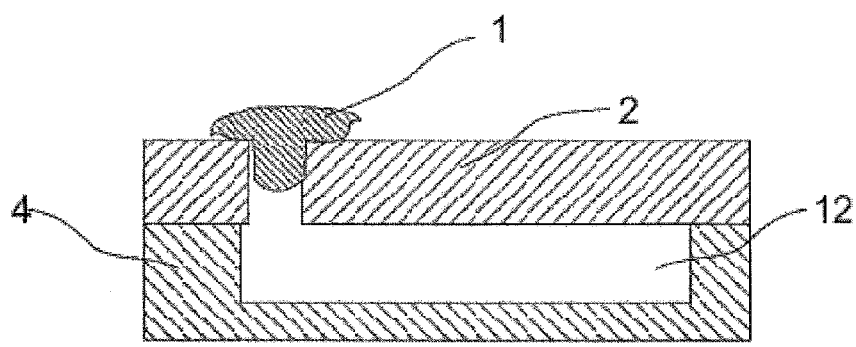
Figure 1S:
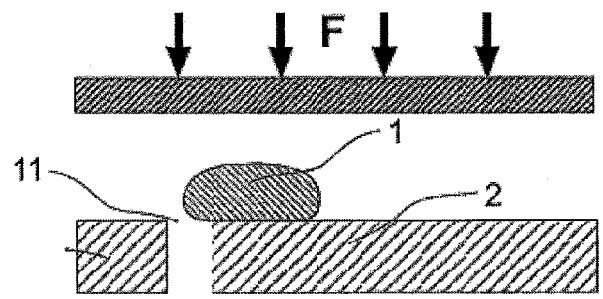
Figure 1T:
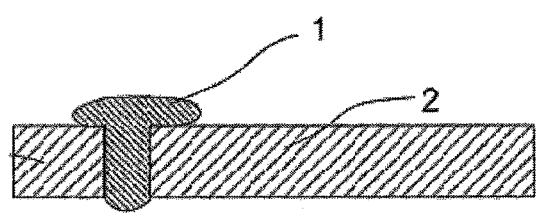
Figure 1U:
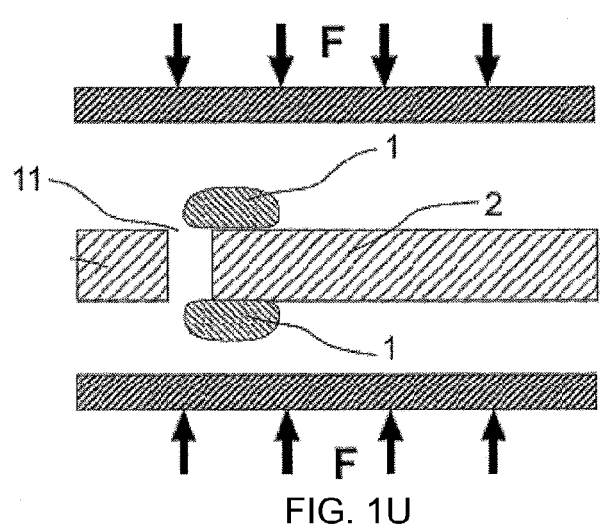
Figure 1V:
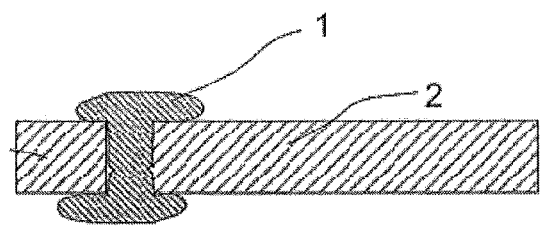

In one embodiment the substrate prior to forming said plug is at least partially coated with at least one metal in the region of said at least one hole. FIG. 1k depicts an embodiment where two coatings 7 and 6 are applied to the substrate 2 in a region around the hole prior to the plugging. In one embodiment a non-metallic substrate is coated with a metal. This has the advantage that a metal-metal seal can be created provided that said piece of material is metal.

In one embodiment said material is a metal. In one embodiment said material is selected from Au, Al, Cu and Ni. These metals have the advantage of being possible to melt with an electric arc and suitable flowing properties. In one embodiment said material is a metal alloy comprising at least one metal selected from the group consisting of Au, Al, Cu and Ni.

In one embodiment said material is an organic material, preferably a polymeric material.

In one embodiment said material is an inorganic material, preferably selected from the group consisting of glass and ceramic.

In one embodiment said substrate comprises at least one of a) a metal, and b) a ceramic.

Figure 3:
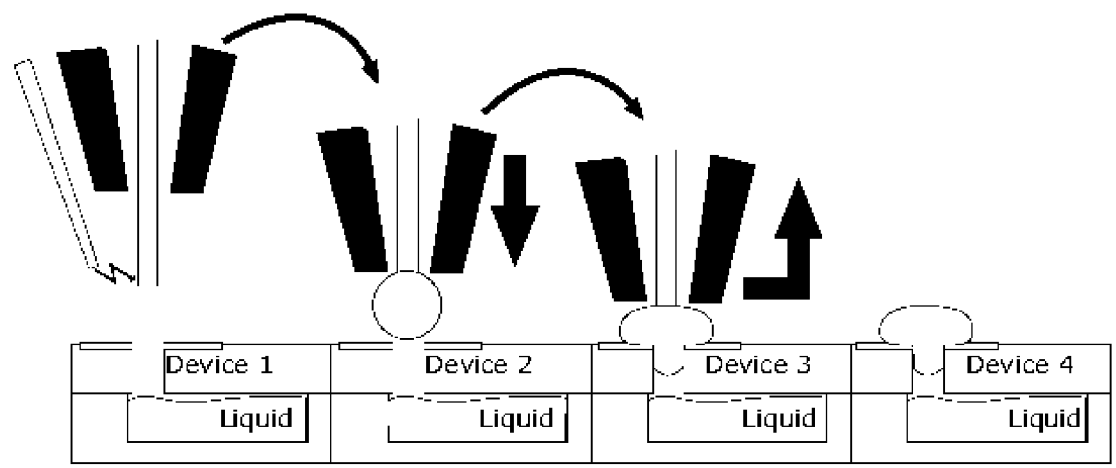
FIG. 3 depicts an embodiment with a gold wire bond plugging process. A gold ball is formed by an electrical discharge, the ball is bonded to the substrate by force and ultrasonic energy is applied with the bond capillary, the wire is sheared of by a horizontal motion (i.e. a motion parallel to the substrate surface) of the bond capillary, yielding a plugged device.

In one embodiment said piece of material is melted by electricity. In one embodiment said piece of material is melted by creating an electric arc. In FIG. 3 an embodiment where an electric arc is used to melt the piece of material is depicted. In the embodiment depicted in FIG. 3 the material is conducting and is provided in the shape of a wire. The electric arc is created between the wire and an electrode.

In one embodiment said piece of material is provided in the form of a wire. Such an embodiment is depicted in FIG. 3.

In one embodiment said piece of material is melted and subsequently cooled after melting and before pressing said piece of material against said hole. In one embodiment it is cooled to room temperature. In another embodiment it is cooled to a temperature below 100° C. In one embodiment it is cooled to below 75° C. In one embodiment it is cooled to below 50° C. In one embodiment it is cooled to below 40° C. In one embodiment it is cooled to below 37° C. In one embodiment it is cooled to below 25° C. It is an advantage to provide a possibility to plug the cavity at low temperature with respect to temperature sensitive matter in the cavity. In an alternative embodiment said piece of material is not cooled significantly after melting and before pressing said piece of material against said hole.

In one embodiment the plug is a hermetic seal. In one embodiment the plug is a conductor. In one embodiment the plug is an electrode.

In one embodiment a wire is utilized when the plug is formed and said wire is in one embodiment coated, preferably said coating is selected from the group consisting of a chemical coating, a biochemical coating, and an electrical coating. The coating is in one embodiment chemical including but not limited to a catalytic coating and getter. The coating is in one embodiment a biochemical coating including but not limited to antibodies, drug molecules, and enzymes. The coating is in one embodiment an electrical coating including but not limited to a conductor, an insulator, a dielectric coating, and a metal coating.

In one embodiment the material is provided as a wire and the wire reaches into the volume after plugging. Examples of such embodiments are depicted in FIGS. 1 $n$ and $o$ respectively. In one embodiment at least a part of said piece of material acts as a vacuum getter material.

In one embodiment the material is provided as a wire and the wire is attached by ball bonding and/or wedge bonding in the vicinity of the hole, so that the wire at least partially covers the hole. Subsequently material is pressed into the hole.

In one embodiment at least one channel is communicating with said hole. Such a channel can be used for various purposes. An example of such a channel 5 is depicted in FIG. 1 $b$.

In one embodiment said at least one hole is the opening of a cavity. In one embodiment said cavity is filled with a fluid before plugging the hole. In one embodiment said cavity is under vacuum after plugging. In one embodiment said cavity comprises an overpressure after plugging.

For embodiments in which a cavity is under vacuum after plugging the plug is preferably pressed once again against the hole, while still under vacuum. In one embodiment said piece of material is pressed against the substrate centered on the hole. In an alternative embodiment said piece of material is pressed against the substrate centered on a point adjacent to the hole. FIGS. 1$q$ and $r$ as well as FIGS. 1 $s$ and $t$ give examples of such embodiments.

An embodiment with said piece of material adjacent to the center of the hole enables sealing of vacuum cavities or cavities with over pressure. In one embodiment said material, after being pressed onto the substrate, is additionally pressed with a flat tool operating in a pressure controllable chamber.

FIGS. 1$m$, 1$n$, 1$o$, 1$q$, 1$r$, 1$s$, 1$t$, 1$u$, and 1$v$ give examples of such embodiments. In semiconductor industry, such a tool is known as a so called substrate bonder or wafer bonder. In the invention described herein, such a bonder enables wafer-level sealing of many cavities simultaneously at an atmosphere different from 1 atm absolute pressure, e.g. vacuum or over pressure.

In one embodiment said cavity is formed in a single substrate 2 by underetching from at least one entrance hole. Examples of such embodiments are depicted in FIGS. 1$c$ and $p$ respectively.

In one embodiment said at least one substrate is a part of a device selected from the group consisting of a gyroscope, an accelerometer, an IR-detector, a sensor comprising a liquid electrolyte, a drug delivery system, an actuator comprising liquid, an optical lens comprising a liquid, and a shutter. This method can be used for the manufacture of various integrated circuits intended to be used in vacuum.

In one embodiment at least one further coating is applied on at least a part of the plugged substrate. FIGS. 1$e$, $f$, $g$, and $h$ show embodiments where additional coatings 6, 7 are applied after plugging. Thereby a further layer is created on the plug, adding suitable properties to the plug depending on the choice of the additional coating.

In one embodiment said substrate 2 comprises through holes and is attached to another substrate 4 to create a cavity. FIGS. 1$a$, $b$, $e$, $f$, $g$, $h$, I, $j$, $k$, $l$, $m$, $n$, $o$, $q$, $r$, show examples of such embodiments. This has the advantage of providing a suitable method for the manufacture of a cavity.

In one embodiment said piece of material is pressed against the substrate centered on the hole. In an alternative embodiment said piece of material is pressed against the substrate centered on a point adjacent to the hole. FIGS. 1$q$ and $r$ as well as FIGS. 1 $s$ and $t$ give examples of such embodiments.

In one embodiment a piece of material is pressed against said hole in said substrate from both sides. FIGS. 1$u$ and $v$ give an example of such an embodiment.

Figure 4:
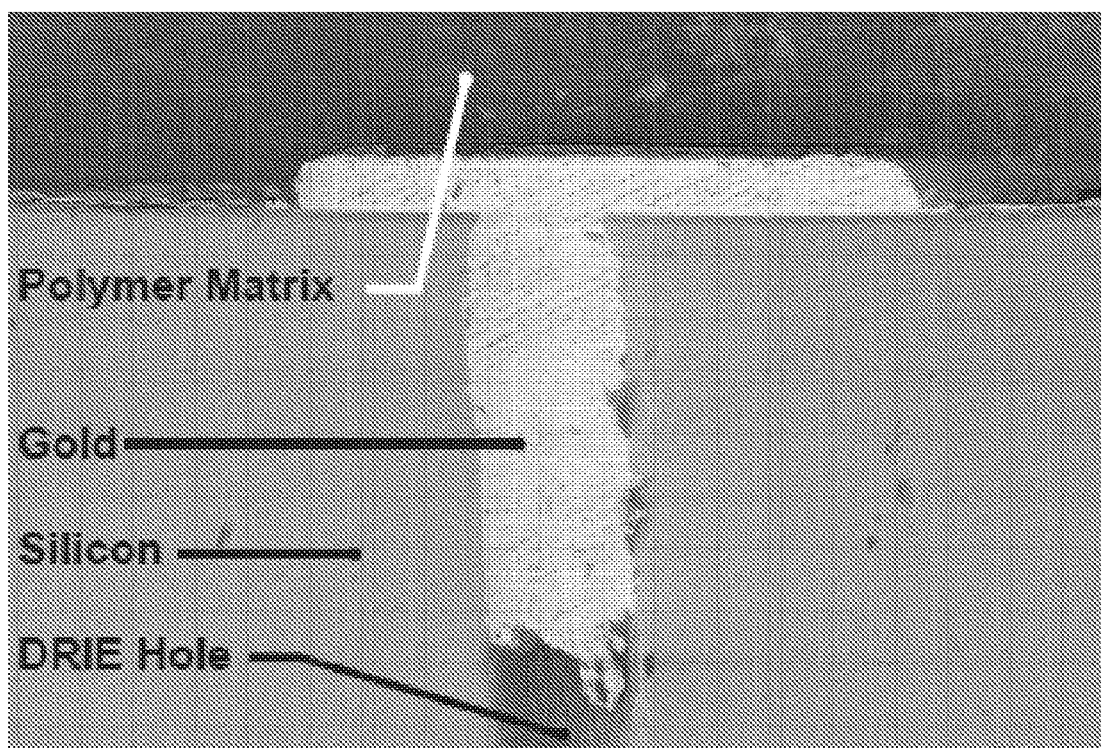
FIG. 4 shows a cross sectional SEM image of an embodiment with a plugged access port.

The tool which is used to press the piece of material against the hole is in one embodiment a commercially available wire bonding machine. One embodiment of the tool used to press the piece of material against the hole is depicted in FIG. 3. FIG. 4 shows an embodiment where a wire bonder has been used to create the plug. In one embodiment a flat tool is pressed against the piece of material. Examples of such embodiments are depicted in FIGS. 1$m$, $n$, $q$, $r$, $s$, $t$, $u$, and $v$. In one embodiment another tool is pressed against the piece of material. In one embodiment a flat tool is pressed against the plug after the plugging.

In one embodiment the tool is able to perform ball bonding, in one embodiment the tool is able to perform wedge bonding. In yet another embodiment the tool is able to perform both ball bonding and wedge bonding.

In one embodiment piece of material is subjected to ultrasonic sound waves during at least a part of said pressing of said piece of material against the hole.

In one embodiment said tool is removed from said piece of material with a movement parallel to the surface of the substrate. Parallel to the surface of the substrate surface should be interpreted as perpendicular to a normal of the surface of the substrate in the region of the hole. This will smear off the piece of material from the tool.

In one embodiment the least one substance is brought into said hole before said piece of material is pressed against said hole, preferably said substance comprises a vacuum getter material. Thus there is provided the possibility to add a vacuum getter material to a cavity and then to seal the cavity hermetically with a plug.

In a second aspect there is provided a plugged hole manufactured by providing a piece of material, wherein said piece of material has a larger dimension than said at least one hole, wherein said piece of material has been pressed against the hole with a tool so that at least a part of said material is in said hole forming a plug, wherein said hole has a largest dimension of from 1 μm to 300 μm.

The features and embodiment described above for the method of plugging a hole also applies for the plugged hole.

In one embodiment said plug is adapted to be opened by at least one selected from pressurizing, electrochemical dissolution, and application of a force.

In one embodiment the surface of the substrate 2 at least partially comprises metal, and wherein said piece of material comprises metal and forms a metallic bond to said metal on the substrate surface.

Other features and uses of the invention and their associated advantages will be evident to a person skilled in the art upon reading the description and the examples.

It is to be understood that this invention is not limited to the particular embodiments shown here. The following examples are provided for illustrative purposes and are not intended to limit the scope of the invention since the scope of the present invention is limited only by the appended claims and equivalents thereof.

EXAMPLES

Example 1

It is demonstrated that this method by plugging the access port to 50 μl (11×11×0.4 mm) large bulk micro machined cavities. The tested access port diameters were between 20 and 55 μm. This was chosen to fit the 25 μm diameter bond wire which could form free air balls up to around 75 μm in diameter. The access ports were placed over the sloping KOH-etched sidewalls, where the silicon is thicker, since the wire bond capillary applies a pressure when the wire bond is formed. Designs with only two access ports and with up to 80 ports spread out along the edge of the cavity were tested.

Figure 2:
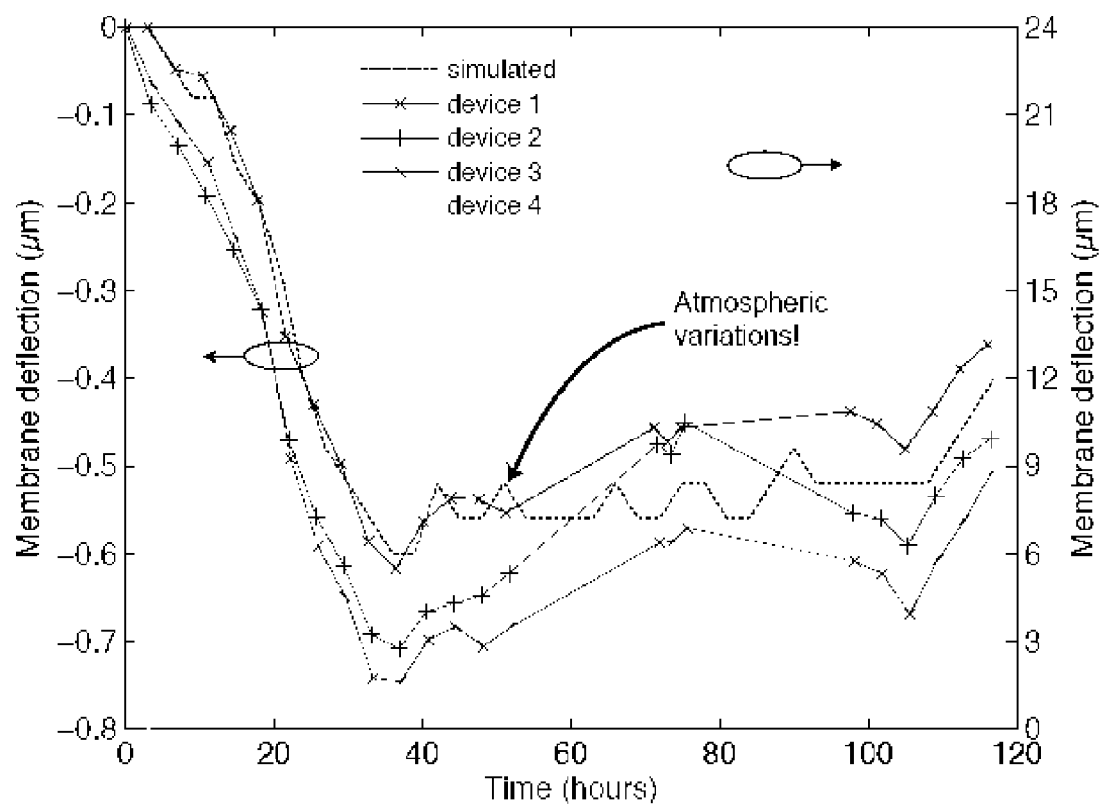
FIG. 2 shows measurement made with an optical profilometer of the membrane deflection over time in order to evaluate the plugging. Device 4 has a fine leak of about $6*10^{-8}$ mbarL/s. The deflection variations of the plugged cavities fit well to the atmospheric pressure variations. The leak rate of the plugged cavities is below the limit of detection, which under these conditions is $6*10^{-12}$ mbarL/s per plugged port.

A liquid plugging demonstrator was fabricated according to the process scheme indicated in FIG. 2. 100 mm diameter and 550 μm thick silicon wafers were used for cavity substrates. A hard mask was defined on the back side of the wafer in a thermally grown silicon dioxide layer using a photo resist mask and dry etching in an CHF3/CF4-based plasma. 400 μm deep cavities were formed by KOH etching, followed by a wet silicon dioxide removal in buffered HF. The cavities were vacuum plugged by anodic bonding to a Pyrex wafer. Circular holes were deep reactive ion etched into the top silicon side down into the cavities using a 7 μm thick photo resist mask. The top side of the wafer stack and the upper portion of the access ports were then metalized by sputter deposition of 100/500 nm of TiW/Au. The open cavities were evacuated and filled, at wafer scale, with red dyed water. The wafer was then dried with dry nitrogen and a lint free cloth. The filled cavities were plugged by plugging the access ports by wire bonding a "bump" at the top of the holes. The ball bonding process is illustrated in FIG. 3. A free air ball is initially formed at the end of the gold wire by an electrical discharge to the gold wire. The formed ball is bonded to the substrate with the aid of force and ultrasonics. The bond capillary is then moved perpendicular to the device surface while still in contact with the bonded ball, shearing of the gold wire before moving away from the substrate. The plugging was performed using a fully automated Esec 3100+ wire bonder (Esec Ltd, Switzerland) operating with a chuck temperature of 40° C. The wire bonder has the so-called "bump mode" software option that enables bump structures in an automated fashion without any special adjustment of the hardware. The wire bonding throughput during processing was up to 15 plugs/s without optimizing anything for improved speed. This translates to a rate 7.5 cavities/s or in our case the full 100 mm wafer in less than 4 seconds. The primary speed limitation is the movement range of the bond head in the wire bonder.

The result of the plugging process is illustrated in the SEM picture shown as FIG. 5. For comparison this figure also shows an empty access port with 37 μm diameter. The used ball size of 75 μm proved to be sufficient to reliably plug holes smaller than 42 μm. The bump would shear of with the wire during the wire bonding for larger diameter holes. No issues in scaling up the gold wire diameter are expected, and consequently the ball size and sealable access port diameter. The current limitation in wire diameter is related to the configuration of the wire bonder used.

Figure 6:
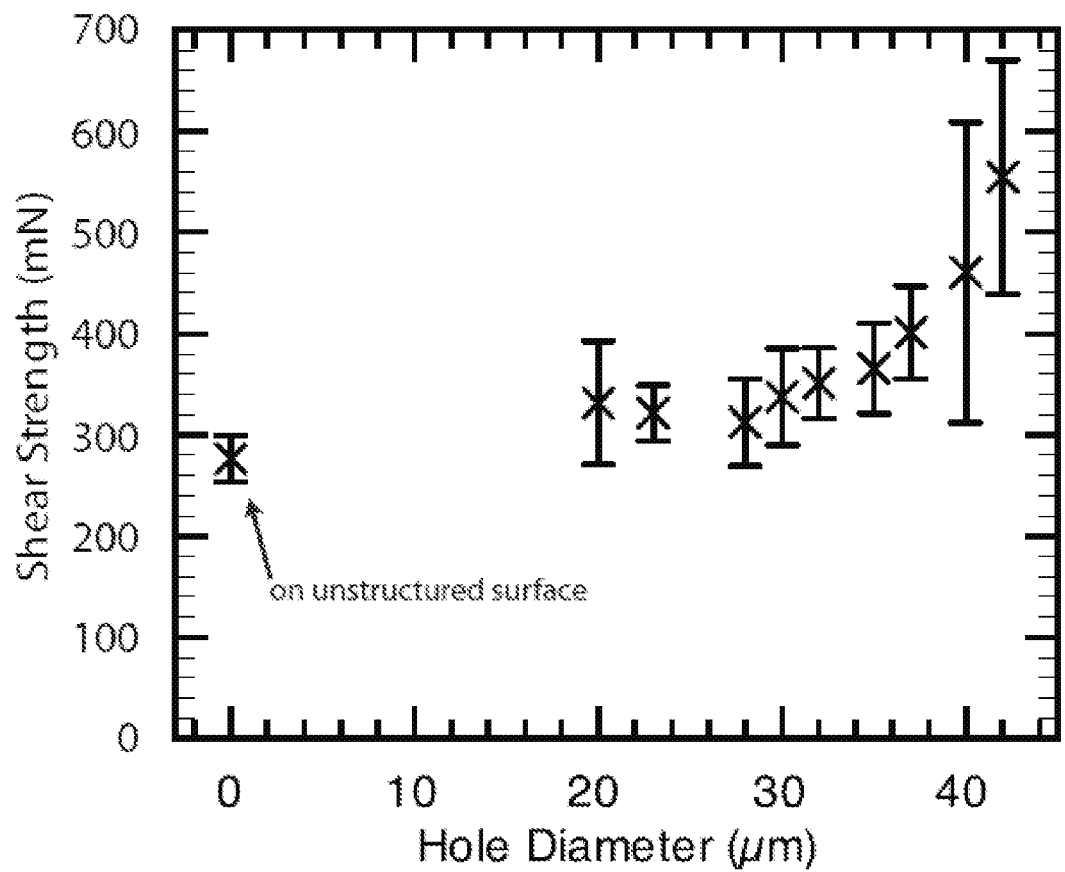
FIG. 6 displays the shear strength of wire bonded plugs for different hole dimensions. Bonds on an unstructured surface is shown at x=0 mm for reference. Error bars correspond to 1 sigma.
Figure 7:
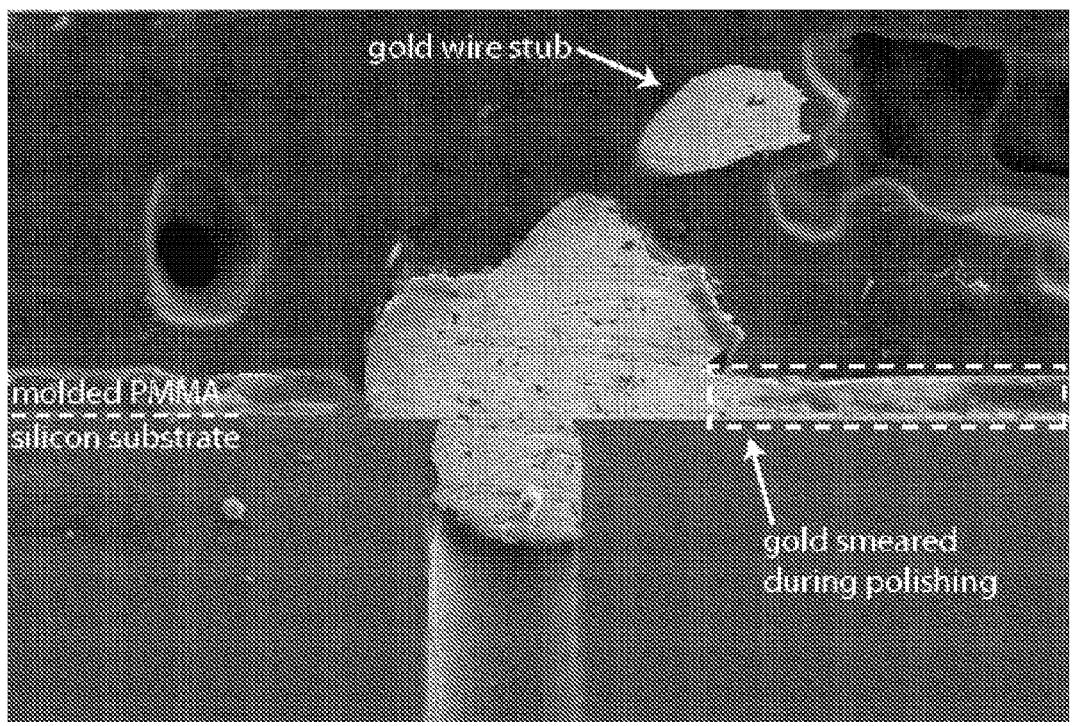
FIG. 7 shows a cross sectional view of a wire bonded plug in a fluid access port. The entire chip was embedded in PMMA and polished until the center of the access port was reached. The port diameter is 30 mm.

The mechanical adhesion of ball bonds placed on holes with different hole sizes were investigated using a shear tester (2400PC, Dage Ltd., UK). Bonds placed on unpatterned substrates were also measured for comparison. The average of at least five measurements and their standard deviation are plotted for hole diameters from 20 to 42 μm in FIG. 6. The increase in shear strength for larger hole diameters indicates that a significant amount of gold was pushed inside the hole during the bonding process. This was also confirmed by SEM imaging a cross section of a plugged access port, shown in FIG. 7. A small constriction is also visible at the top of the access port. As is seen, this did not negatively impact the filling of the access port.

In order to investigate the hermeticity of the plugs, the absolute leak rate was measured by a helium mass spectrometer (Pfeiffer Vacuum GmbH, Germany) attached to the backside of plugged through holes (without the glass wafer). The connection to the chip was made using rubber o-rings with vacuum grease. This method only gives the current leak rate, although in a wide measurement range. Several blank tests were initially made using polished unstructured silicon pieces. All the results are shown in table 1.

TABLE 1

Measured helium leak rates for different hole diameters, <40 μm appears to produce hermetic plugs

| Hole diameter [μm] | Leak rate [$10^{10}$ mbarL/s] |
|---|---|
| no hole | ~1 |
| 24 | 1.4 |
| 37 | 1.2 |
| 44 | 5 |
| 48 | 5 |
| 52 | 74 |

The leak rate, for bonds on holes with a diameter less than 40 μm, was measured to be better than the noise level of the leak detector, which is $1\times10^{10}$ mbarL/s. This leak rate level is three orders of magnitude better than the requirements on hermetic packages of this size according to MIL standard 883F Test Method 1014.11. This methods pass criteria is related to having a long diffusion time for water to enter a cavity. The same is applicable here, but for a material flow in the other direction. Hence, the plug is considered to be hermetic for liquid encapsulation applications. The larger holes had increasingly larger leak rates. This is consistent with the behavior seen during wire bonding, the yield of bonding on the larger holes was much poorer.

Plugged and diced devices were additionally burst tested by heating them slowly on a hot plate. At around 130° C. the lids of the devices started bulging outwards noticeably. At around 140° C. the 1.9 mm wide anodic bond surrounding the cavity failed, additionally indicating a good mechanical attachment of the plug.

In this example there is described a plugging process. The manufactured plugs have been shown to be fully hermetic for liquid packaging applications. The plugs were also thoroughly tested mechanically and were shown to be strongly attached. This method enables liquids to be easily and efficiently integrated and packaged into MEMS devices.

Example 2

Test cavities were fabricated using anodic bonding. Thermal oxidation was used to prepare a double-side polished silicon substrate. The substrate was subsequently subjected to backside lithography and KOH etch of the cavities. All remaining silicon dioxide layers were wet-stripped. Subsequently the silicon substrate was anodically bond to a borofloat substrate. Thereafter lithography and subsequent deep reactive ion etching was used to make the access ports. Subsequently gold was deposited by sputter deposition on top of the silicone dioxide substrate.

1.) An electrical discharge locally melted a gold wire and formed a sphere at the end of the wire. 2.) The gold bump was bonded with an offset in the etched hole in order to not fully cover and clog the access port.

A polished Si wafer was placed on the bumps and the stack was placed in a wafer bonder. After reaching a chamber pressure of $10^{-5}$ mbar a bond force was applied. The bumps were pressed into the holes and hermetically plugged them.

FIG. 4 shows a cross sectional SEM image of a plugged access port. The cross section was made by grinding and polishing. The gold has been pressed 90 microns into the access port.

The difference between the cavity pressure and the ambient pressure causes a bending of the silicon membrane. A long-term observation of the bending curvature is used to investigate the hermeticity.

The vacuum plugging was done in two steps. First, gold bumps were wire bonded off-center on 30 µm diameter access ports to otherwise enclosed cavities using a wire bonder. The bumps were optimized for a high and narrow bump shape and were bonded at a rate of 14 bumps/s. The cavity wafer was then transferred to a wafer bonder where the bumps were compressed under vacuum with a force of 3.5 kN, about 9 N/bump. This plastic deformation of the bumps caused the cavities to become hermetically plugged. A cross section of a plugged access port is shown in FIG. 4. The compression caused the gold from the bump to fill the access port to a depth of 90 µm.

The membranes of the vacuum-plugged cavities deflected when exposed to atmospheric pressure. The deflection was measured by white light interferometry and corresponded to a cavity pressure of less than 10 mbar when compared to FEM simulations of a membrane model made using Comsol.

The membrane deflection was measured in air over 5 days in order to evaluate the leak rate. In FIG. 2 the results of the deflection change for 4 cavities are compared to a membrane simulated using the atmospheric pressure variations measured at a close-by weather station. Three of the four cavities appear to be plugged. The fourth device has a fine leak of $6*10^{-8}$ mbarL/s, if a linear relationship between the deformation and the pressure is assumed. The deflection variations of the 3 plugged cavities fit well to the atmospheric pressure variations. The leak rate into the plugged cavities is below the limit of detection, which for this method is $6*10^{-12}$ mbarL/s per plugged port.

In this example there is described a vacuum plugging process using deformation of wire bonded "bumps" into access ports of preformed cavities. No leak was detected with the evaluation method, showing that the leak rate is smaller than $6*10^{-12}$ mbarL/s. This method enables uncomplicated and cost efficient vacuum plugging using mature commercial tools.

The invention claimed is:

1. A method for at least partially inserting a plug into a hole, said method comprising the steps of:
    a) providing at least one substrate with at least one hole wherein said at least one hole has a largest dimension of from 1 µm to 300 µm,
    b) providing a piece of material, wherein said piece of material has a larger dimension than said at least one hole,
    c) pressing said piece of material against the substrate centred on a point adjacent to the hole, with a first tool,
    d) removing the tool from the piece of material, and
    e) additionally pressing said piece of material at least partially into the hole with a flat tool operating in a pressure controllable chamber,
    wherein said at least one hole is the opening of a cavity, and wherein said cavity is filled with a fluid before forming said plug.

2. The method according to claim 1, wherein said first tool is removed from said piece of material with a movement parallel to the surface of the substrate.

3. The method according to claim 1, wherein said cavity is under vacuum after forming said plug.

4. The method according to claim 1, wherein the substrate prior to forming said plug is at least partially coated with at least one metal in the region of said at least one hole.

5. The method according to claim 1, wherein said material is subjected to at least one selected from heat, and ultrasound during pressing said piece of material against the hole.

6. The method according to claim 1, wherein said material is a metal.

7. The method according to claim 1, wherein said material is selected from the group consisting of Au, Al, Cu and Ni.

8. The method according to claim 1, wherein said plug is an electrode.

9. The method according to claim 1, wherein a piece of material is pressed against said substrate from both sides.

* * * * *